US007667466B2

(12) United States Patent
Jackson

(10) Patent No.: US 7,667,466 B2
(45) Date of Patent: Feb. 23, 2010

(54) TARGET TESTER INTERFACE

(75) Inventor: Peter Jackson, Embarrass, MN (US)

(73) Assignee: Benchmark Electronics, Angleton, TX (US)

( * ) Notice: Subject to any disclaimer, the term of this patent is extended or adjusted under 35 U.S.C. 154(b) by 389 days.

(21) Appl. No.: 11/669,418

(22) Filed: Jan. 31, 2007

(65) Prior Publication Data

US 2008/0180110 A1 Jul. 31, 2008

(51) Int. Cl.
*H01H 31/02* (2006.01)
*A47K 1/04* (2006.01)
*F16M 13/00* (2006.01)
*A47B 81/00* (2006.01)

(52) U.S. Cl. .................... 324/555; 324/158.1; 248/128; 248/429; 312/25

(58) Field of Classification Search ................. 234/555; 248/128, 429; 312/25
See application file for complete search history.

(56) References Cited

U.S. PATENT DOCUMENTS

| | | | | | |
|---|---|---|---|---|---|
| 4,961,559 | A | * | 10/1990 | Raymor | 248/429 |
| 5,207,115 | A | * | 5/1993 | Takei | 74/479.01 |
| 6,869,191 | B2 | * | 3/2005 | Connelly et al. | 353/94 |
| 7,267,317 | B2 | * | 9/2007 | Kato et al. | 248/429 |
| 2004/0227534 | A1 | * | 11/2004 | Mueller | 324/758 |

OTHER PUBLICATIONS www.macpanel.com website, Overview, 5 pages, dated Apr. 24, 2007, available prior to Jan. 31, 2007.
www.vpc.com website, Mass InterConnect Overview, 4 pages, dated Apr. 24, 2007, available prior to Jan. 31, 2007.
Benchmark Electronics Target Tester, 1 page, available prior to Jan. 31, 2007.

* cited by examiner

*Primary Examiner*—Jeff Natalini
(74) *Attorney, Agent, or Firm*—Merchant & Gould P.C.

(57) ABSTRACT

An electronics testing assembly includes a housing, a tester assembly, and an activation assembly. The housing is sized to retain the activation assembly and at least one electronics testing device. The tester enclosure is configured to house a plurality of tester connector interfaces that are mounted to a first connector plate. The activation assembly includes an actuator assembly and a plurality of activation connector interfaces mounted to a second connector plate. The actuator assembly is configured to move the second connector plate between a lowered vertical position and a raised vertical position within the housing while maintaining a fixed orientation of the tester enclosure relative to the housing. In the lowered vertical position the activation connector interfaces are spaced apart from the tester connector interfaces, and in the raised vertical position the activation connector interfaces are engaged with the tester connector interfaces to create an electrical connection.

6 Claims, 15 Drawing Sheets

TARGET TESTER INTERFACE

TECHNICAL FIELD

The present invention generally relates to electronic test equipment, and more specifically relates to test equipment mechanical interfaces.

BACKGROUND

Many types of electronic circuit assemblies from low to high complexity configurations must be tested for proper functionality prior to being sold or installed for use. A customized electronics tester typically is required to set up the testing necessary for any given electronic circuit assembly to be tested. The time and cost associated with setting up a customized electronics tester for each electronics circuit assembly is an unreasonable solution for obtaining adequate testing of a given electronic circuit assembly. Various test systems such as rack mounted test systems have been designed as a complete test solution for medium to high complexity electronic circuit assemblies. Through an instrument interface, multiple electronic circuit assemblies can be tested on the test system using custom test fixtures. A common instrumentation base is included in the test system, thus minimizing the cost of individual test solutions by reusing the instrumentation for testing multiple electronic circuit assemblies. Some common features in a rack mounted test system include, for example, fixed and programmable power supplies, PXI (PCI eXtensions for Instrumentation) chassis and instrumentation, controlled air lines for fixture automation, USB, an industrial rack-mounted computer loaded with National Instruments Test Stand and other supporting software tools, a keyboard, and monitor.

SUMMARY

One aspect of the present disclosure relates to an electronics testing assembly that includes a combination of off-the-shelf and custom parts. A rack and stack instrumentation method configuration includes a pneumatically automated interface that provides mechanical design reuse and a reduction in over all testing costs for testing electronic circuit assemblies. The electronic testing assembly includes a pneumatic actuator, linear motion in the mechanical interface, and elimination of a pinch point, which improves safety for operators.

The above summary is not intended to describe each disclosed embodiment or every implementation of the inventive aspects disclosed herein. Figures in the detailed description that follow more particularly describe features that are examples of how certain inventive aspects may be practiced. While certain embodiments are illustrated and described, it will be appreciated that the invention/inventions of the disclosure are not limited to such embodiments.

Figure 1:
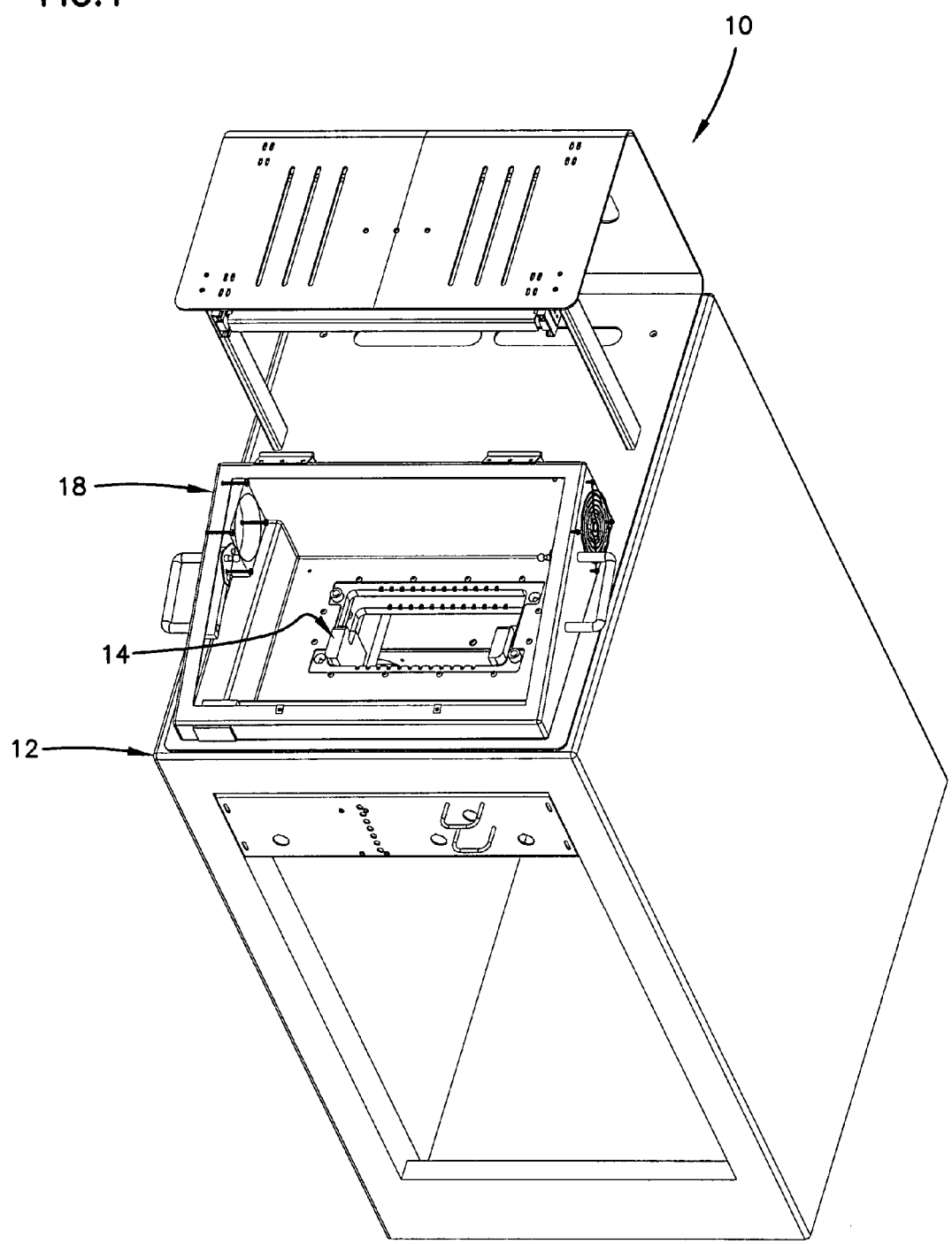
FIG. 1 is a front perspective view of portions of an example electronics testing assembly in accordance with principles of the present disclosure.
Figure 2:
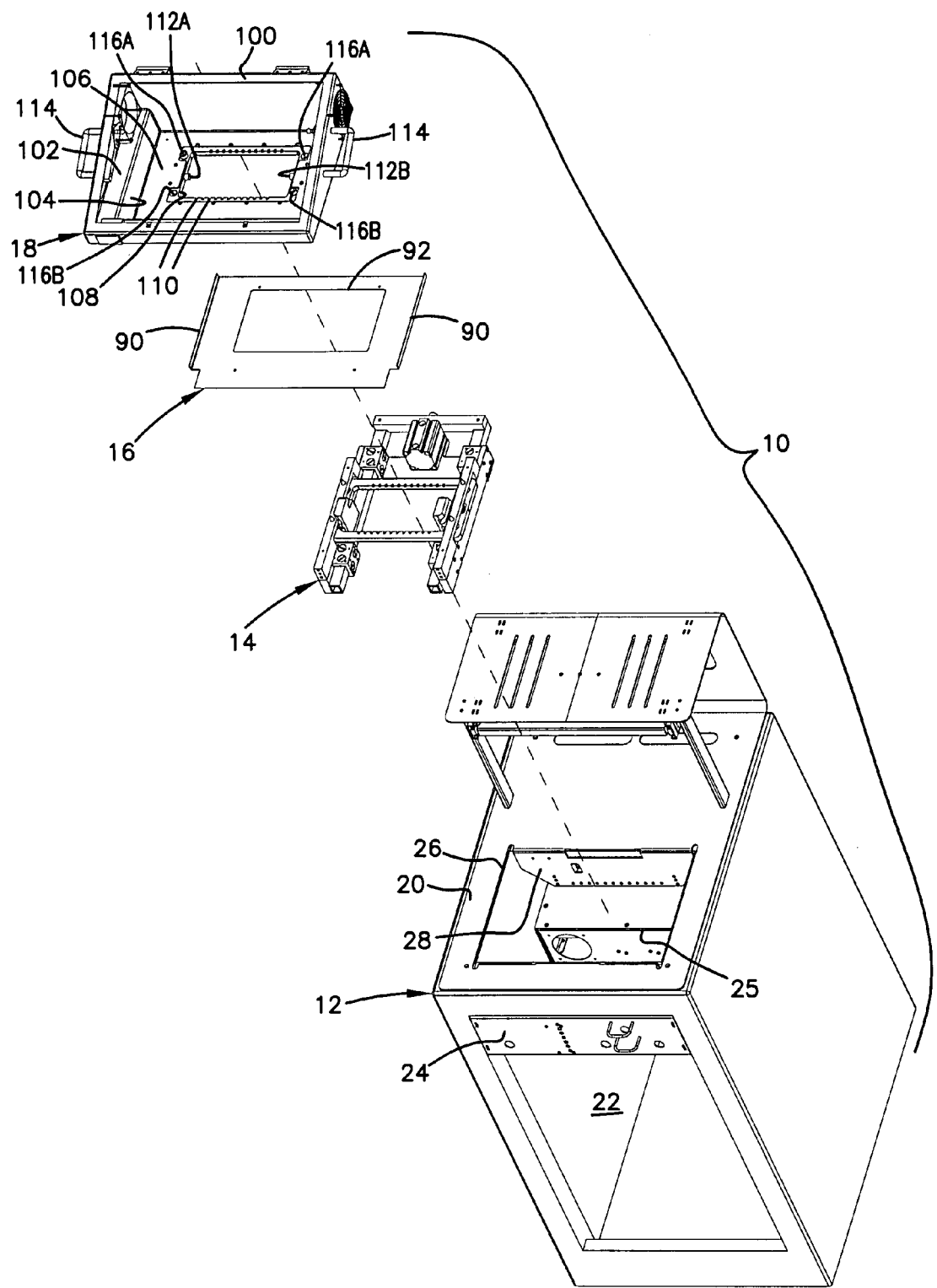
FIG. 2 is an exploded perspective view of the example electronics testing assembly shown in FIG. 1.
Figure 3:
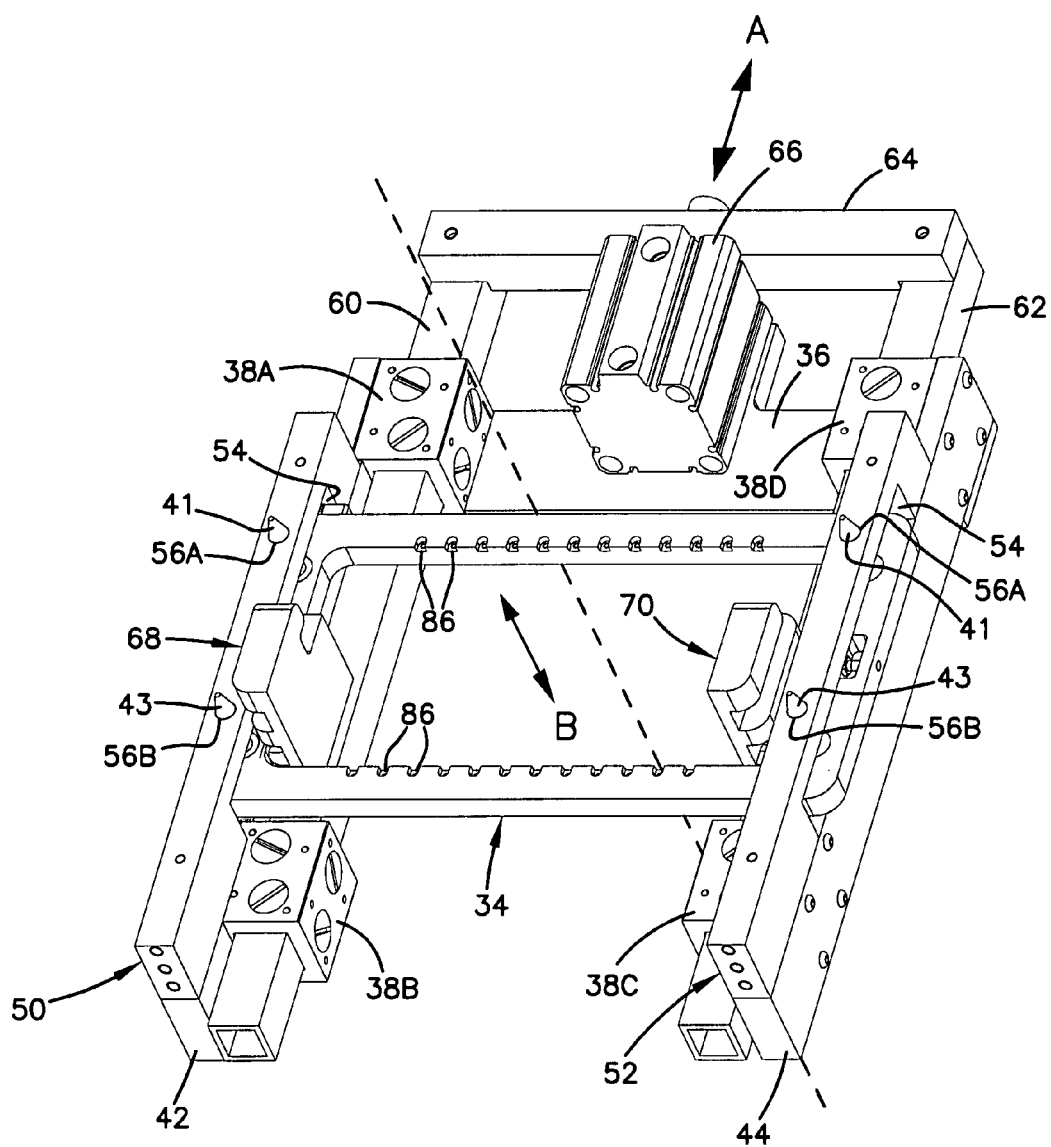
FIG. 3 is a perspective view of an activation assembly for use in the electronics testing assembly shown in FIG. 1.
Figure 4:
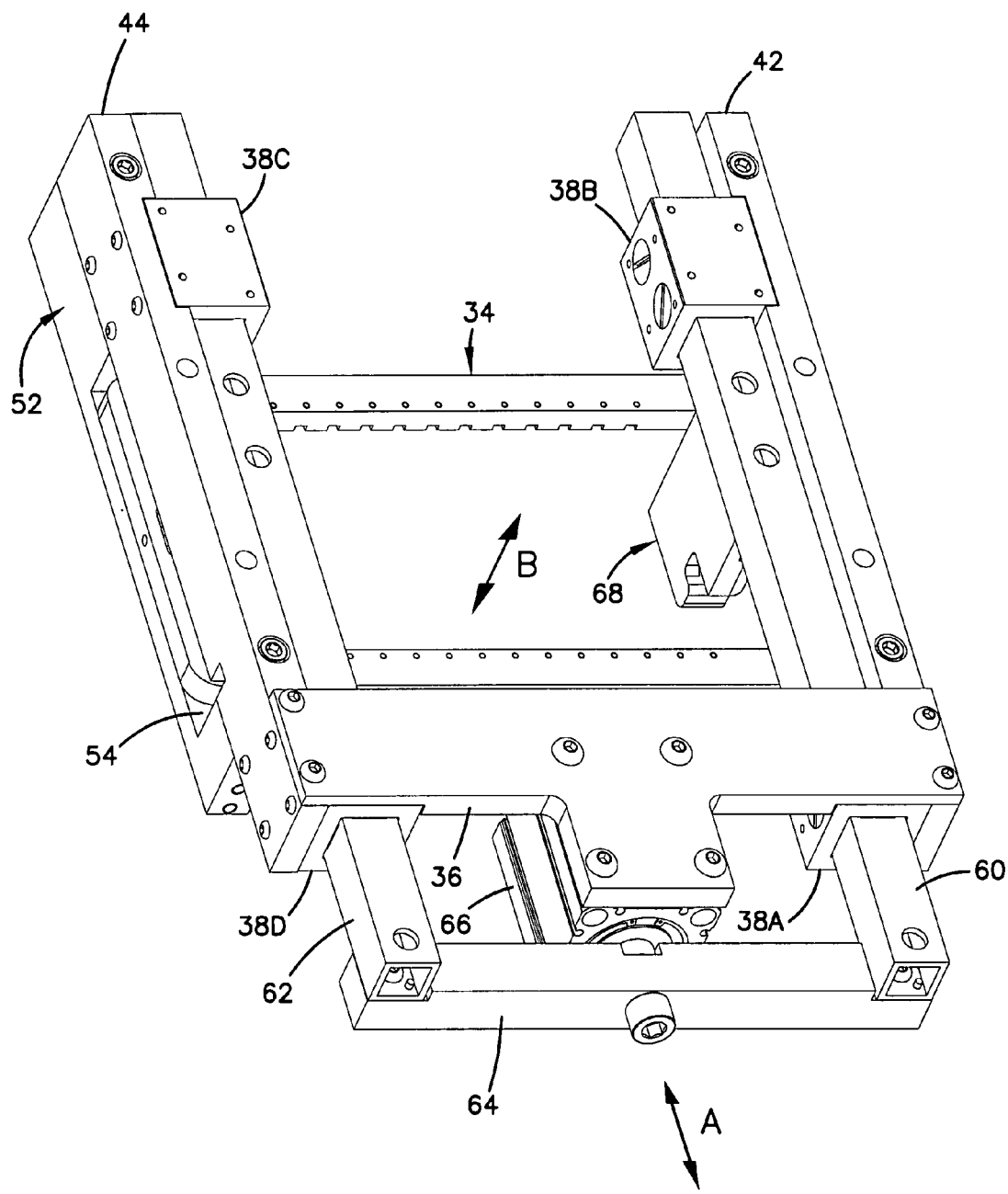
FIG. 4 is a bottom perspective view of the activation assembly shown in FIG. 3.

While the inventive aspects of the present disclosure are amenable to various modifications and alternate forms, specific embodiments thereof have been shown by way of example in the drawings, and will be described in detail. It should be understood, however, that the intention is not to limit the inventive aspects to the particular embodiments described. On the contrary, the intention is to cover all modifications, equivalents, and alternatives falling within the spirit and scope of the inventive aspects.

DETAILED DESCRIPTION OF THE PREFERRED EMBODIMENT

Figure 15:
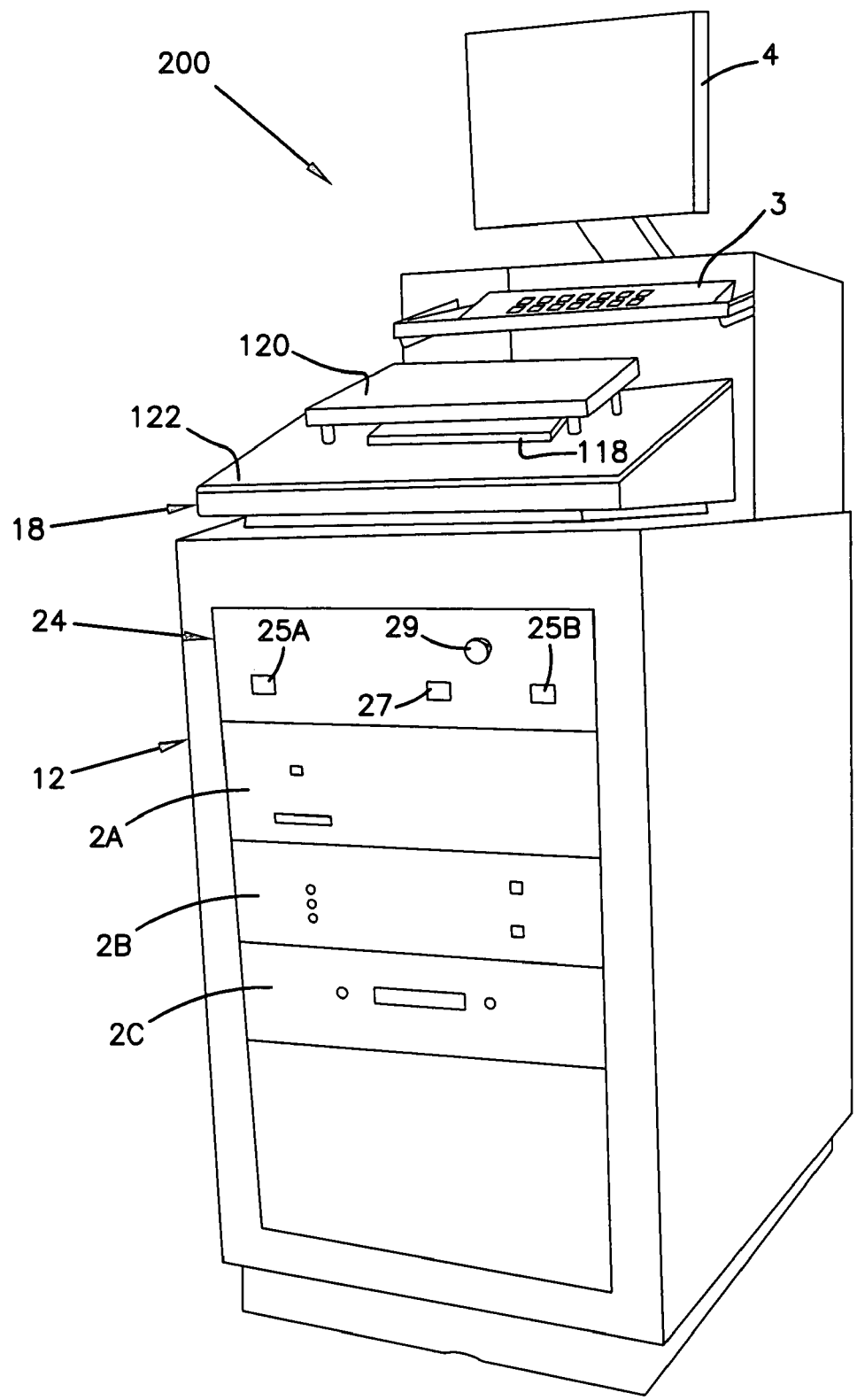
FIG. 15 is a front perspective view of the example electronics test assembly shown in FIG. 1 with additional features.

The electronics testing assemblies disclosed herein provide for quick, easy installation of any number of custom test fixtures (also referred to herein as tester enclosures) developed for a particular electronic product type or family of products. Referring to FIG. 15, an example electronics testing assembly 200 is shown and described. The electronics testing assembly 200 includes a tester enclosure or test fixture 18 that includes a top cover 122 to which a device under test (DUT) 118 is placed, and a device hold down 120 is mounted. Variations of this design can be used as needed to mount the product under test, meet testing specifications, etc.

The tester enclosure is installed on the housing 12 by setting the tester enclosure 18 on a top surface of the housing 12 with a portion of the tester enclosure 18 extending into the housing to a position adjacent the activation assembly. Actuating a pair of engagement buttons 25A, 25B on the control panel 24 results in a mechanical and electrical connection between the activation assembly and the tester enclosure features. The tester enclosure 18 is released from this electrical and mechanical connection by engaging a release button 27 or an emergency stop switch 29 on the control panel 24.

After the mechanical and electrical connection of the tester enclosure is made with the activation assembly, the device under test can be electronically tested. The electronic tests are conducted by communicating signals between various test equipment (e.g., test equipment 2B, 2C) mounted to the housing 12 and the device under test via the electrical connection between the tester enclosure 18 and the activation assembly. Power and signal interface to the device under test itself is typically accomplished via, for example, cable connections and/or a pneumatically engaged spring probe field. Compressed air can be used to drive the fixture pneumatics and can be routed through the interface between the tester enclosure 18 and the activation assembly of the housing 12 using specialized air adapters and other fixtures. The operator of the electronics testing assembly 10 can monitor the test procedures via the monitor 4 and control some of the testing operations via the key board 3.

The electronic and mechanical interface between the tester enclosure 18 and the activation assembly of the housing 12 is typically one of the most important aspects of a functional test system, such as the electronic testing assembly 200. This is the case because most of the connections necessary for testing the device under test are coupled through the interface between the tester enclosure 18 and the activation assembly of the housing 12. The interface must provide a mechanical connection that is sturdy, resistant to wear, and precise enough to facilitate repeatable, accurate, electrical measurements. The mechanical connection must also facilitate dependable electrical connection between various electrical connectors on both the tester enclosure 18 and the activation assembly of the housing 12. Thus, the electrical integrity of the inner connections and the mechanical engagement of the tester enclosure 18 to the activation assembly of the housing 12 are important considerations addressed by the electronic testing assemblies disclosed herein.

Example of FIGS. 1-14

Referring now to FIGS. 1-14, another example electronics testing assembly 10 is shown and described. The electronic testing assembly 10 includes a housing 12 (also referred to as a cabinet or base), an activation assembly 14, a dust shield 16, and a tester enclosure 18. Typically, the housing 12, activation assembly 14, dust shield 16 are assembled together and sometimes referred to as a tester base (as shown in FIG. 15, a plurality of test equipment 2A-C) can be mounted within the housing 12). Further, a monitor 4 and keyboard 3 can be mounted to the housing 12 as well. While the housing 12 may include some basic equipment such as a processor, power sources, and various user interfaces (e.g., monitor 4 and keyboard 3), many different types of equipment can be added or combined in order to customize the tester base for testing of specific types of electronic equipment or specific features common to different types of electronic equipment.

The housing 12 includes a top surface 20 and a plurality of side walls that define in an enclosure 22. The housing 12 also includes a control panel 24, a top surface aperture 26, and an actuation assembly support structure 28 (see FIG. 2). When mounting the tester enclosure 18 to the housing 12, portions of the test enclosure 18 engage the top surface 20 and other portions of the test enclosure 18 extend through the top surface aperture 26 into the enclosure 22. The activation assembly 14 is mounted to the support structure 28 within the enclosure 22. A plurality of actuators and control devices are mounted to the control panel 24 (e.g., engage, release and stop actuators 25A, B, 27, 29 shown in FIG. 15). Other control equipment is housed in a control box 25 also positioned in the enclosure 22.

Figure 5:
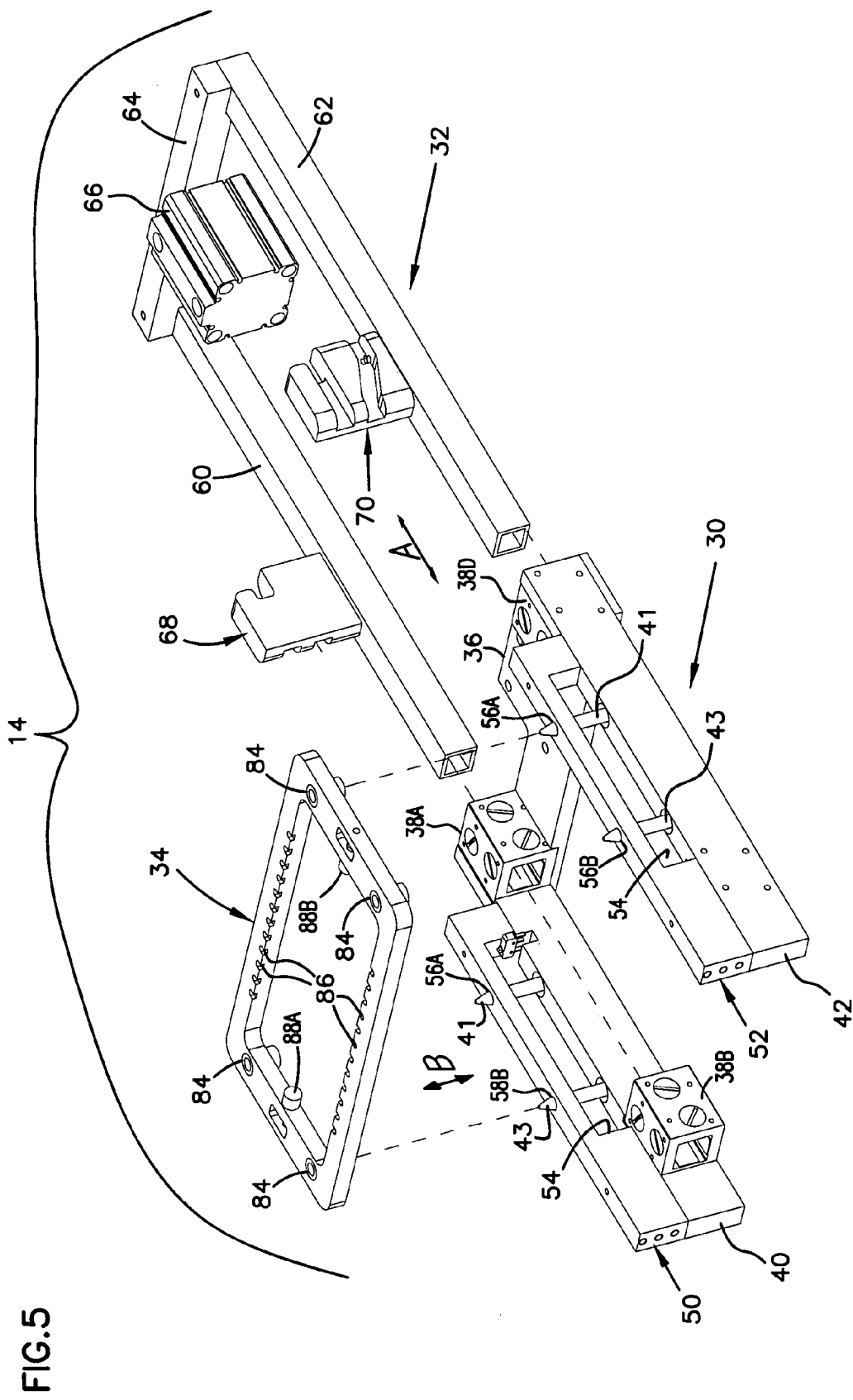
FIG. 5 is an exploded perspective view of three subassemblies of the activation assembly shown in FIG. 3.
Figure 6:
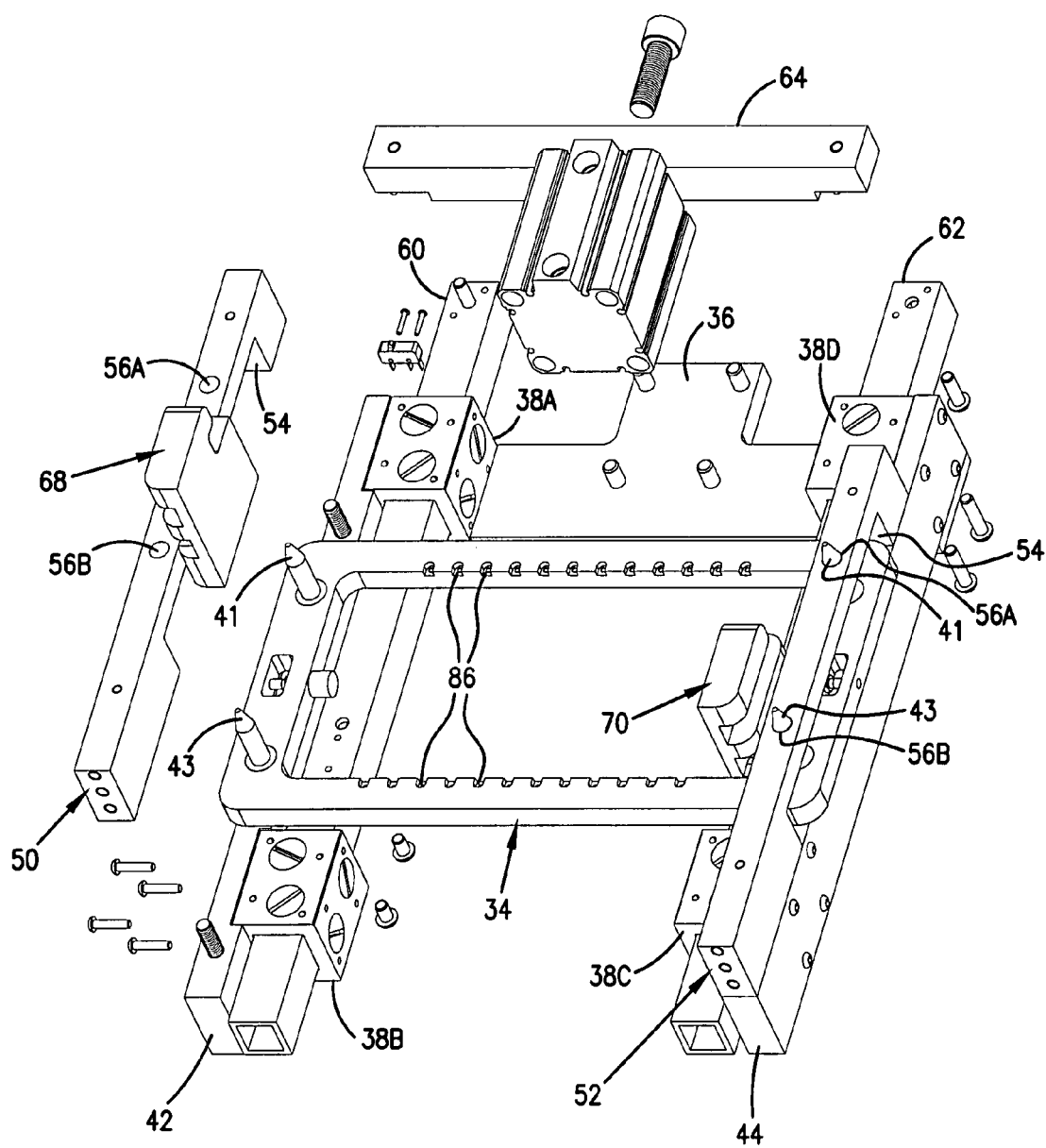
FIG. 6 is a partially exploded perspective view of the activation assembly shown in FIG. 3.

Referring now to FIGS. 3-6, the activation assembly 14 includes a support assembly 30, an actuator assembly 32, and a connector plate 34 (see FIG. 5). The support assembly 30 includes an actuator mounting plate 36, slide bearings 38A-D, first and second bottom support stringers 40, 42, and first and second top support stringers 50, 52. Each of the top stringers 50, 52 includes a cut out portion 54 on a side facing the bottom stringers 40, 42, and a pair of guide apertures 56A, B. Each of the bottom support stringers 40, 42 has a pair of guide members 41, 43 mounted thereto. The guide members 41, 43 extend through the guide apertures 56A, B and the top support stringers 50, 52.

The bottom support stringers 40, 42 are mounted to the actuator mounting plate 36. The slide bearings 38A-D are mounted to the bottom support stringers 40, 42. The slide bearings 38A, B and 38C, D are positioned in alignment with each other and include an internal cavity that promotes sliding engagement and positioning of features of the actuator assembly 32 during horizontal movement of the actuator assembly 32.

The actuator assembly 32 includes first and second slide rods 60, 62, a cross bar 64 secured at opposing ends to the slide rod 60, 62, an actuator 66, and first and second slide blocks 68, 70. The actuator 66 includes an actuation rod that moves into and out of the actuator 66 upon activation of the actuator 66. This rod is connected to the cross bar 64. When the activation assembly 14 is assembled together, the actuator 66 is mounted to the actuator mounting plate 36, whereby actuation of the actuator 66 results in relative movement of the slide rods 60, 62 relative to the support assembly 30.

The first and second slide blocks 68, 70 are mounted to the slide rods 60, 62, respectively. The slide blocks 68, 70 are mounted to a top surface of each of the rods 60, 62 and extend in a generally vertical direction. In other arrangements these slide blocks 68, 70 can be secured to the slide rod 60, 62 at other locations and have different configurations as required to provide the desired interface between the connector plate 34 and features of the tester enclosure 18.

Figure 7:
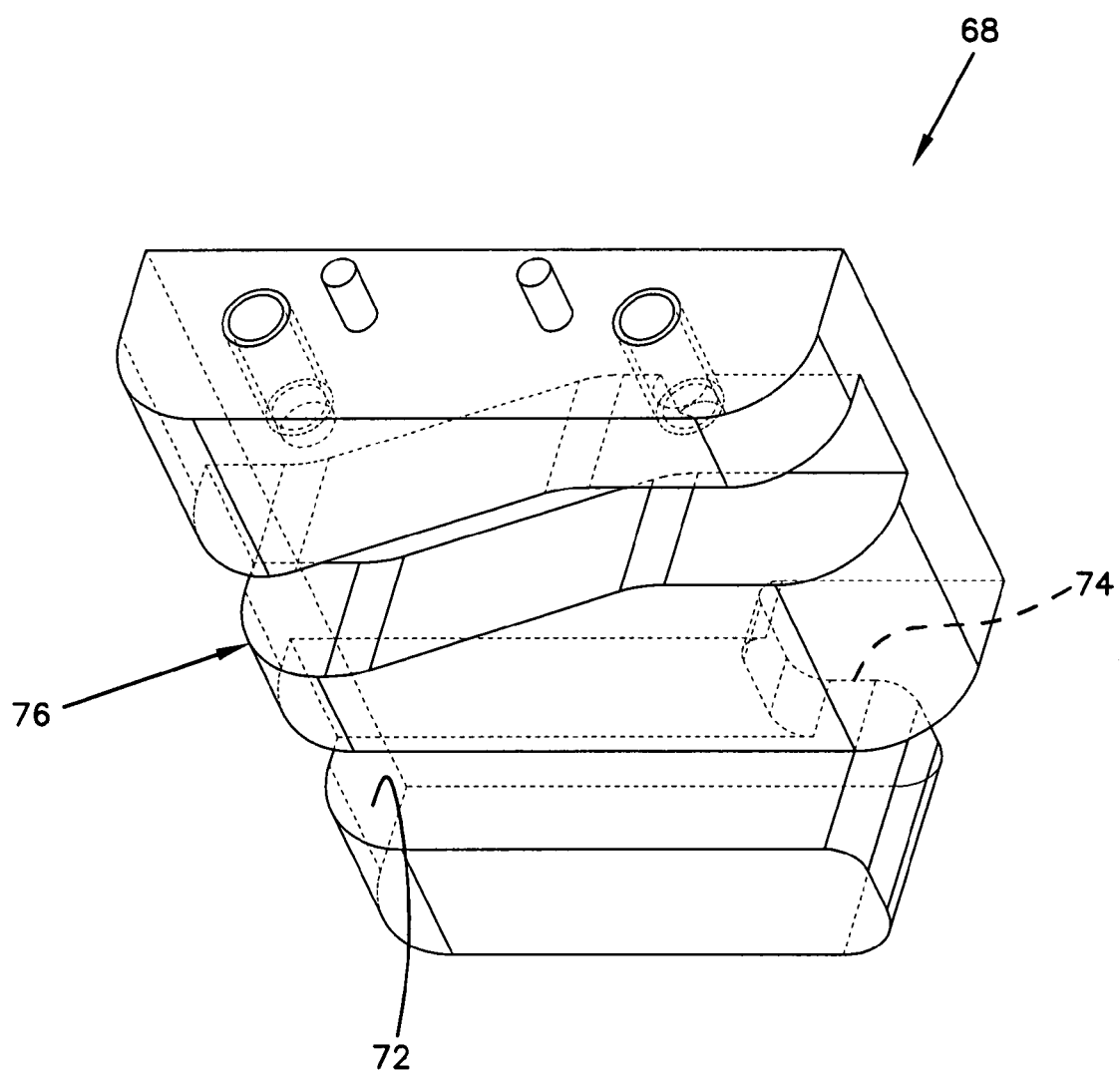
FIG. 7 is a perspective view of one of the slide blocks of the activation assembly shown in FIG. 3.
Figure 9:
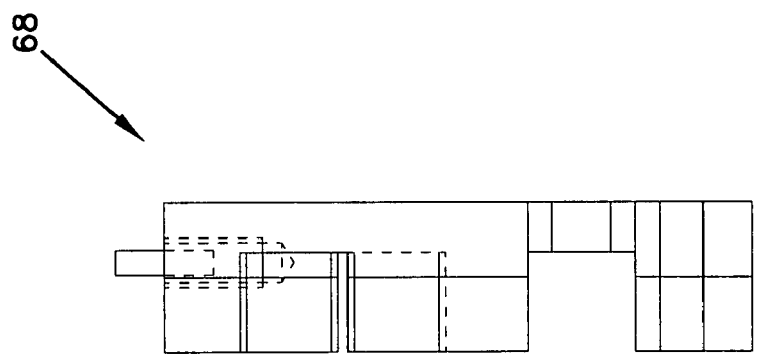
FIG. 9 is a right side view of the slide block shown in FIG. 7.
Figure 8:
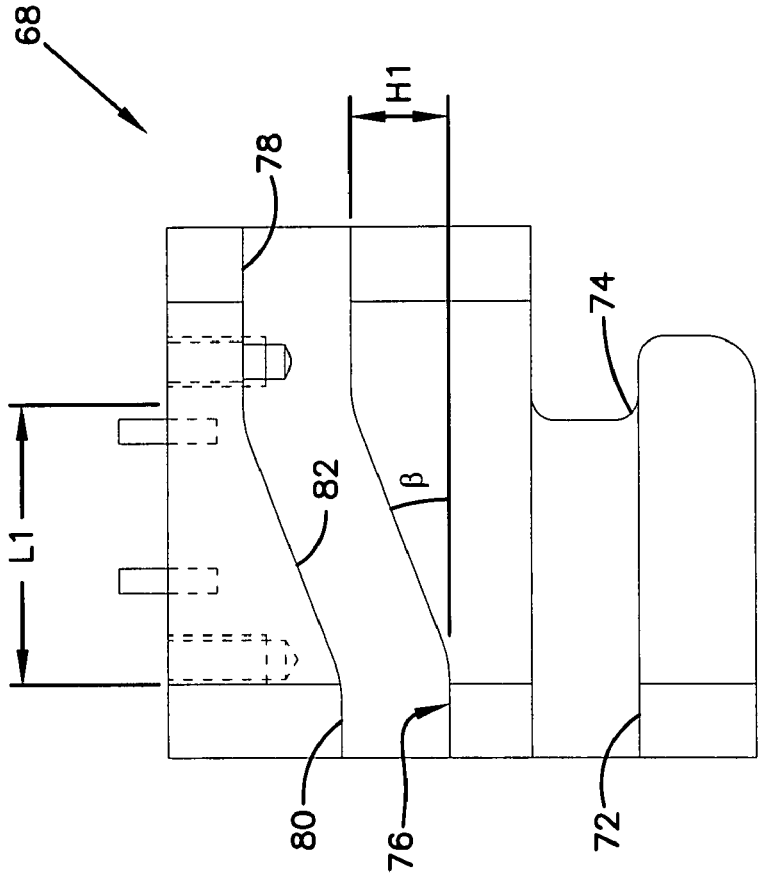
FIG. 8 is a front view of the slide block shown in FIG. 7.
Figure 10:
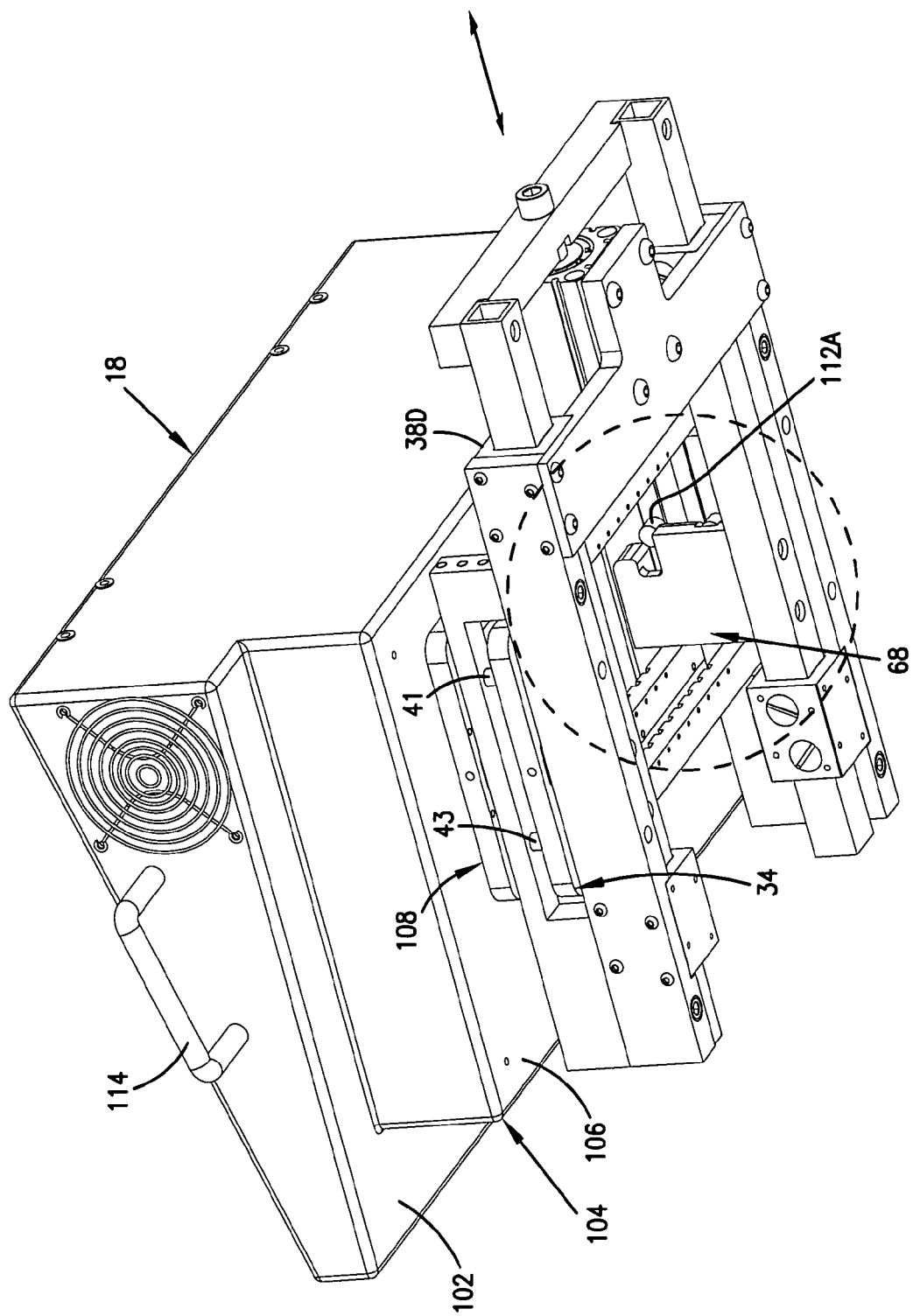
FIG. 10 is a bottom perspective view of a tester enclosure and the activation assembly shown in FIG. 3.
Figure 11:
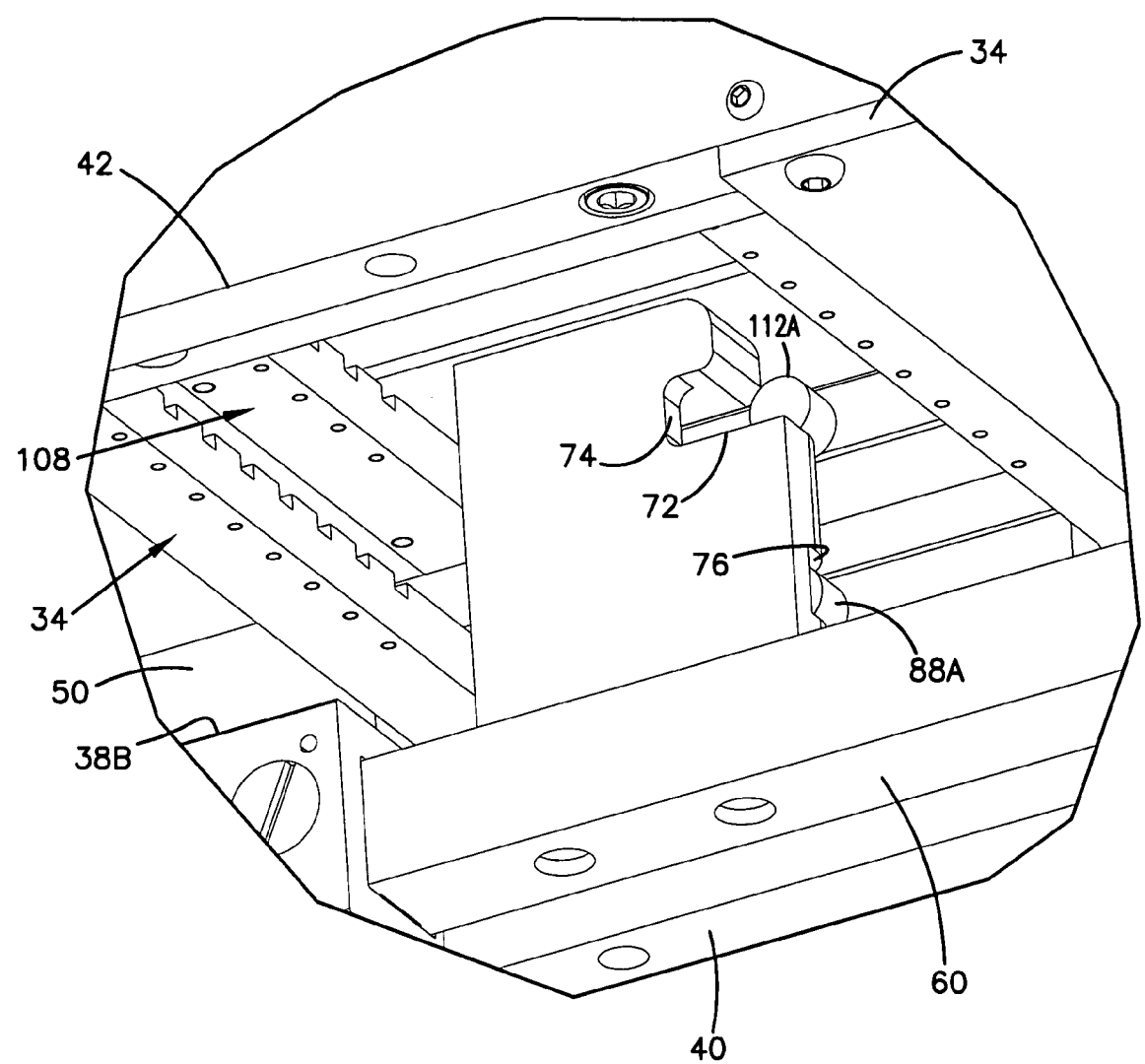
FIG. 11 is a close-up view of the slide block shown in FIG. 10.
Figure 12:
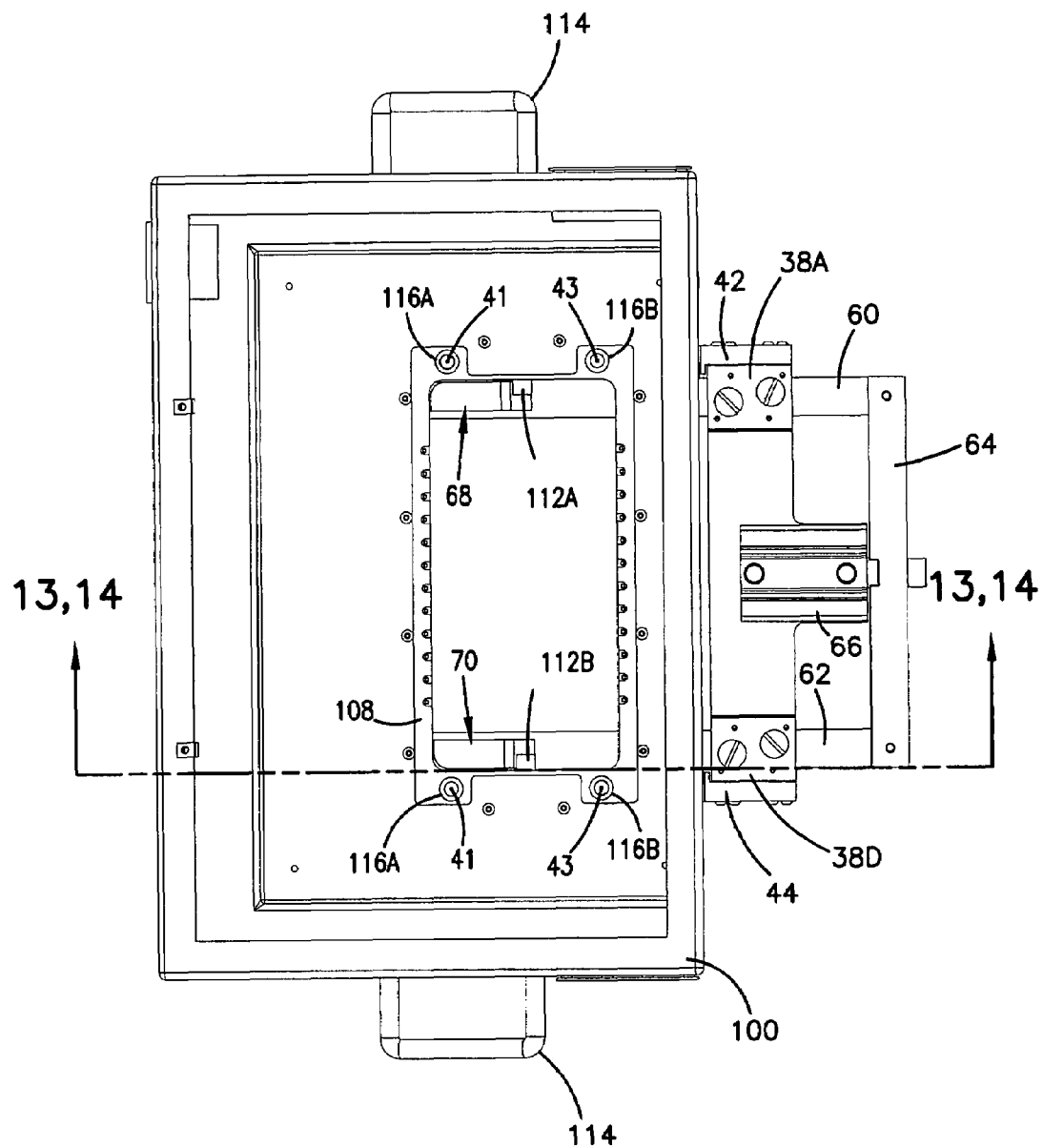
FIG. 12 is a top view of the tester enclosure and activation assembly shown in FIG. 10.
Figure 13:
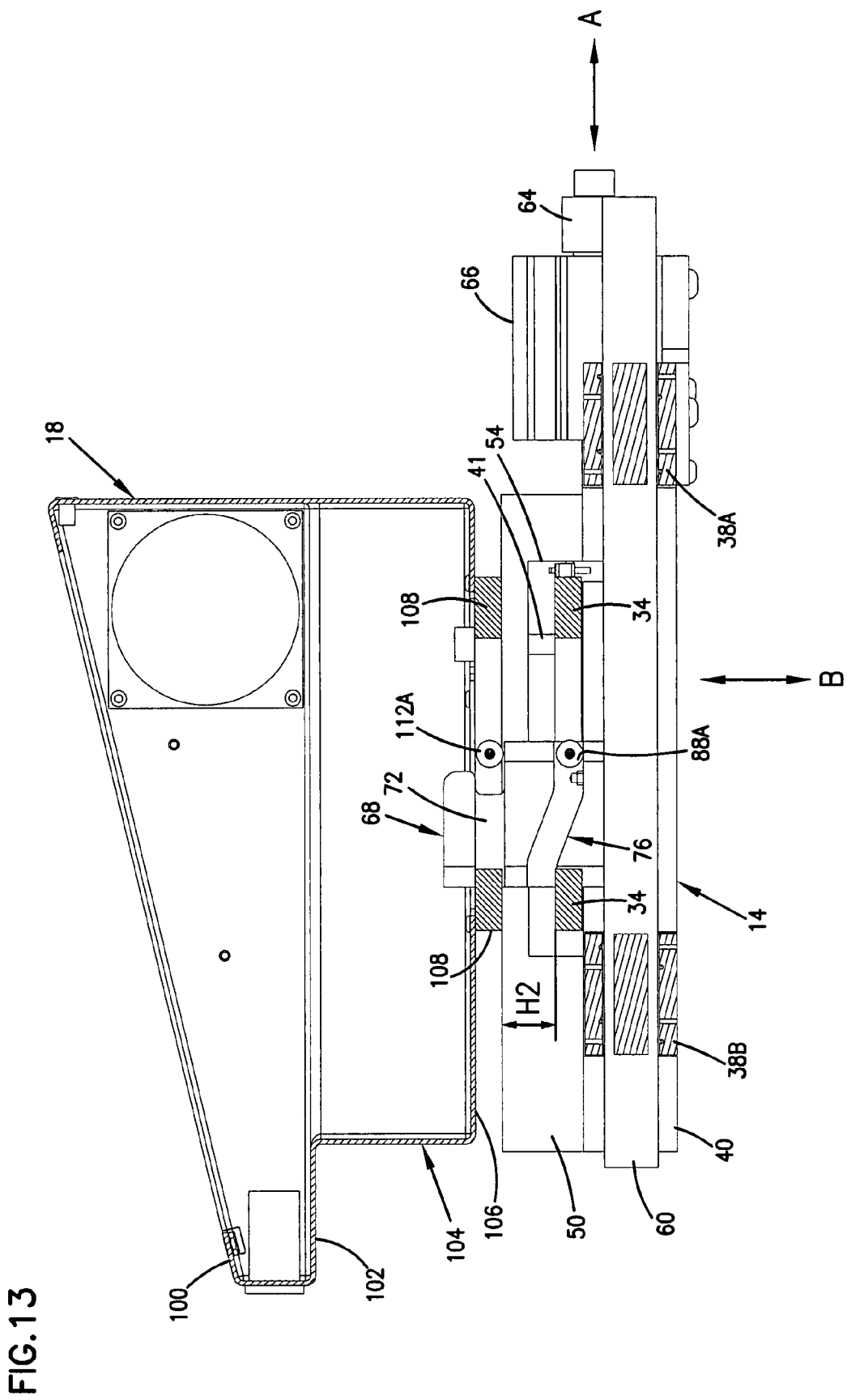
FIG. 13 is a cross sectional view taken along cross sectional indicators 13-13 in FIG. 12 with the tester enclosure and activation assembly disengaged from each other.

Referring to FIGS. 7-9, each of the slide blocks 68, 70 includes a first groove 72 and a sloped second groove 76. The first groove 72 is positioned vertically above the second groove 76 when the slide blocks 68, 70 are mounted to the slide rod 60, 62 as shown in FIGS. 3-6. A notch 74 is formed in the slide block at one end of the first groove 72. The notch 74 can provide improved relative positioning of engagement features of the tester enclosure 18 within the first groove 72 when first positioning the tester enclosure 18 on the top surface 20 of the housing 12.

The second groove 76 includes first and second ends 78, 80 and an angled portion positioned at a location between the first and second ends 78, 80. The angled portion 82 extends at an angle $\beta$ relative to a horizontal plane. The angle $\beta$ is typically in the range of about 5° to about 45°, and more preferably in the range of about 20° to about 25°. The angle $\beta$ and a length L1 of the angled portion 82 result in a change of height H1 (see FIG. 8) between the first and second ends 78, 80. Thus, changing either the length L1 or the angled $\beta$ can result in the desired change in height H1 needed to provide the engagement and disengagement of the mechanical and electrical features of the activation assembly 14 and tester enclosure 18. In one arrangement, the height H1 is in the range of about 2 mm to about 20 mm, and more preferably in the range of about 10 mm to about 15 mm. The grooves 72, 76 are sized to receive follower members of the tester enclosure 18 and connector plate 34, respectively. By moving the slide blocks 68, 70 horizontally with the followers of the tester enclosure 18 and connector plate 34 engaged in the grooves 72, 76, the connector plate 34 is moved vertically relative the tester enclosure 18 due to the sloped configuration of the second groove 76.

The connector plate 34 includes a plurality of alignment bearings 84, a plurality of connector seats 86, and first and second follower members 88A, B. The alignment bearings 84 have an internal shaped sized to receive the guide members 41, 43. The connector seats 86 are configured to receive a plurality of connectors such as those connectors shown in FIG. 16 (described in further detail below). The follower members 88A, B have a cylindrical shape with a circular cross section. The follower members 88A, B extend in a horizontal direction towards a center of the connector plate 34. When the activation assembly 14 is assembled together, the guide members 41, 43 extend through the alignment bearings 84, and the connector plate 34 is positioned within the cut out 54 of the top support stringers 50, 52 so as to be positioned between the bottom stringers 40, 42 and the top stringers 50, 52. The cut out 54 in each of the top stringers 50, 52 is sized sufficiently large to permit vertical movement of the connector plate 34 within the cut out 54. The total distance of vertical travel of the connector plate 34 within the cut out 54 is typically greater than the height H1 defined by the angled portion 82 of the second groove 76 in the slide blocks 68, 70. The interface between the follower members 88A, B and slide blocks 68, 70 is shown in further detail in the cross sectional view of FIGS. 13 and 14 described in further detail below.

The tester enclosure 18 includes a top side surface 100, a bottom engagement surface 102, a connector plate 108 having a plurality of connector seats 110, first and second follower members 112A, B, a bottom extension 104, and a bottom side or surface 106. A pair of handles 114 extend from opposing sides of the tester enclosure 18 to promote easier maneuvering of the tester enclosure 18. A pair of guide apertures 116A, B are positioned on opposing sides of connector plate 108. Alignment bearings can be fit in the guide apertures 116A, B to provide a bearing interface between the apertures 116A, B and the guide members 41, 43 that has, for example, a greater resistance to wear.

The top side 100 is typically configured to support a top cover such as top cover 122 shown in FIG. 15. As described above, the top cover 122 supports a device under test (DUT) 118 for electronic testing purposes. The DUT 118 can be held in position with a device hold down 120. The top cover 122 is removed from FIGS. 1-14 to better illustrate the internal features of the test enclosure 18.

The bottom engagement surface 102 of the tester enclosure 18 maintains a spaced apart orientation relative to the top surface 20 of the housing 12 when the tester enclosure 18 is mounted to the activation assembly 14. The electronic testing assembly 10 is configured such that the bottom engagement surface 102 is spaced apart from the top surface 20 prior to, during, and after actuation of the activation assembly 14 when the tester enclosure 18 is supported on the activation assembly 14. In one embodiment, a spacing of about 3 mm to about 6 mm is maintained. Because the tester enclosure 18 maintains this fixed position during operation of the activation assembly 14, the potential operator pinch point between the tester enclosure 18 and housing 12 is eliminated. Thus, it is unlikely that portions of the operator's body can be caught between the bottom engagement surface 102 and the top surface 20 prior to, during, or after activation the activation assembly 14. The portions of the assembly 10 that are moving relative to each other when activating the activation assembly 14 are contained within the housing 12 and inaccessible by the operator.

Figure 16:
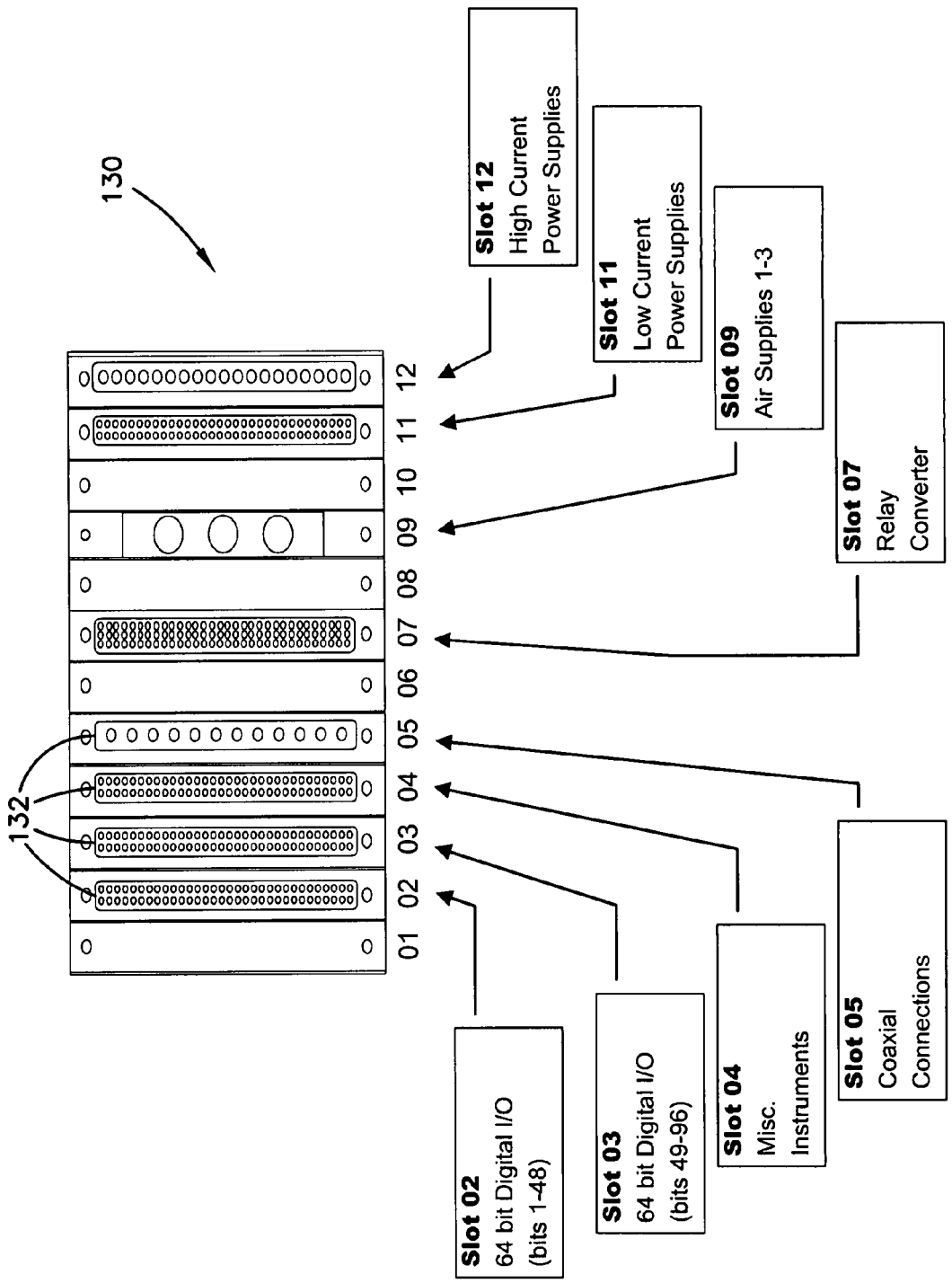
FIG. 16 is a top view of an example tester interface having a plurality of connectors mounted in a plurality of connector slots.

The connector plate 108 supports a plurality of connectors in the connector seats 110 such as these connectors can mate with the plurality of connectors supported on the connector plate 34 (e.g., see example connector configuration for plate 34 shown in FIG. 16). The physical connection of those connectors supported on the connector plate 108 with those connectors supported on the connector plate 34 provides an electrical connection that provides necessary electrical interface between the device under test supported on the tester enclosure 18 and the electronic equipment (e.g., test equipment 2A-C) supported in the housing 12.

The follower members 112A, B are configured with a similar shape and size as those follower members 88A, B. Follower members 112A, B have a generally cylindrical shape with a circular cross section, and extend in a generally inward direction within a common horizontal plane. The follower members 112A, B are sized to fit within the first groove 72. The notch 74 and first groove 72 of the side blocks 68, 70 can be useful for aligning the follower members 112A, B within the first groove 72, or at least adjacent to the first groove 72, whereby horizontal movement of the slide block 68, 70 positions the follower member 112A, B within the first groove 72.

The connector plate 108 is positioned at a bottom side 106 of the bottom extension 104 of the tester enclosure 18 that is positioned within the enclosure 22 of the housing 12. The handles 114 can be used to manually position the tester enclosure 18 on the top surface 20 and remove the tester enclosure 118 after testing of the device under test is complete.

Referring now to FIGS. 10-14, the tester enclosure 18 is shown positioned in engagement with the activation assembly 14. In these Figures, it is assumed that the tester enclosure 18 is positioned at a fixed vertical location with the bottom surface 102 spaced vertically above the top surface 20 of a housing 12. Likewise, the support assembly 30 of the activation assembly 14 is mounted to the actuator assembly support structure 28 of the housing 12, thereby maintaining a fixed horizontal and vertical position of the support assembly 30.

Prior to actuation of the actuation assembly 14, the actuator assembly 32 is maintained at a first, retracted position shown in FIGS. 10-13. In this retracted position, the follower members 88A, B are positioned within the second groove 76 at the first end thereof. The follower members 112A, B of the tester enclosure 18 are positioned in alignment with the groove 74 within the same plane as the first groove 72. In this retracted position, the height or spacing between the connector plates 34, 108 is shown as H2 in FIG. 13. In this position, the electrical connectors supported on each of the connector plates 34, 108 are typically physically and electrically disengaged from each other. Upon activation of the engagement buttons 25A, B on the control panel 24 of the housing 12, the actuation assembly 14 is actuated to move the actuator assembly 32 relative to the support assembly 30 and connector plates 34, 108. The actuation assembly 14 is actuated by extending the rod out of the actuator 66 in a generally horizontal direction. Extending the rod out of the actuator 66 in the direction A moves the cross bar 64, first and second slide rod 60, 62 and the slide blocks 68, 70 in a generally horizontal direction relative to the direction in which spacing H2 is measured between the connector plates 34, 108 (shown as direction B).

Moving the actuator assembly 32 in the direction A results in the follower members 112A, B traveling along the first groove 72 of each of the slider blocks 68, 70 and the follower members 88A, B traveling along the sloped second groove 76 from the first end 78 to the second end 80. Positioning the follower members 112A, B within the first groove 78 provides a fixed horizontal and vertical positioning of the connector plate 108 relative to the support assembly 30 of the activation assembly 14. The guide members 41, 43 of the support assembly 30 extend through the connector plate 34 and into the guide apertures 116A, B of the connector plate 108. As a result, the connector plates 108, 34 are aligned horizontally with each other and the connector plate 34 is constrained to vertical movement only within the cut out 54 of the top support stringers 50, 52. With the follower members 88A, B positioned within the second groove 76 of the slide block 68, 70, moving the slide block 68, 70 in a horizontal direction forces the connector plate 34 to move vertically upward toward the connector plate 108. When the connector plates 34, 108 have mounted to thereto the plurality of connectors in connector seats 86, 110, respectively, those connectors are forced into engagement with each other to provide a mechanical and electrical connection between the tester enclosure 18 and the activation assembly 14. With this mechanical and electrical connection, the device under test supported on the tester enclosure 18 can be electrically tested using test equipment housed in the housing 12.

Figure 14:
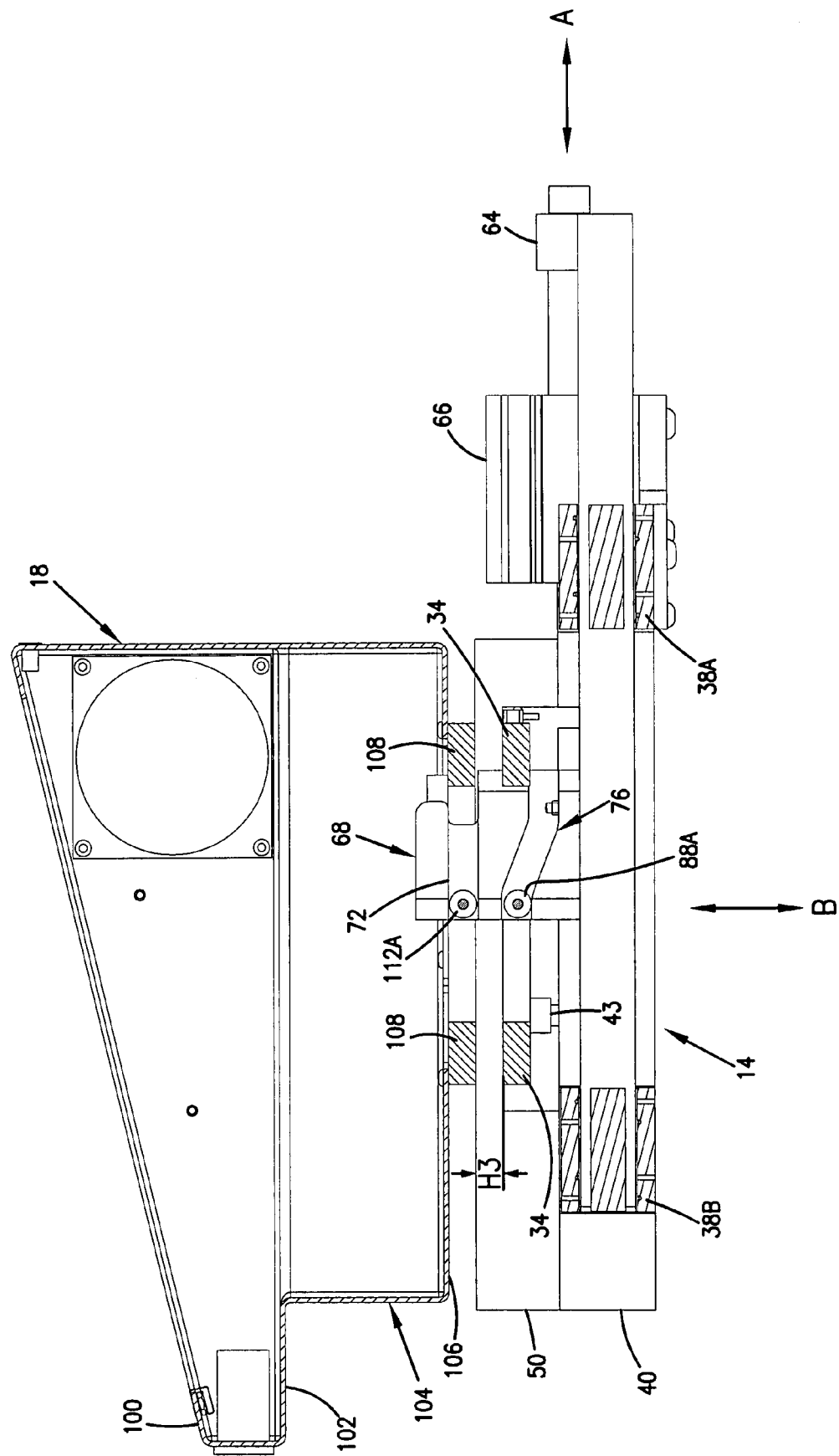
FIG. 14 is a cross sectional view taken along cross sectional indicators 14-14 of FIG. 12 with the tester enclosure and activation assembly in an engaged arrangement.

Upon completion of the horizontal movement in the direction A to provide the activation assembly into an extended position as shown in FIG. 14, the spacing between the connector plates 34, 108 is reduced to a height H3. The difference between the heights H2 and H3 is typically equal to about the height H1 associated with the second groove 76 of the slide block 68, 70. The activation assembly 14 is activated from the extended position shown in FIG. 14 to the retracted position shown in FIG. 13 by engaging the release button 27 or the emergency stop button 29 on the control panel 24 of the housing 12.

The example arrangements disclosed herein are operable using a pneumatically driven assembly that pulls two sets of connectors together onto a set of alignment guide members 41, 43. Pneumatics are used to actuate the actuator 66 of the actuation of assembly 14 to move the connector plate 34 vertically up and down to create the mechanical and electrical connection. The pneumatics are controlled via, for example, electrical solenoid valves that allow for two button control by the operator for engagement (e.g., actuating the actuation assembly 14 from a retracted position to an extended position), and release the connection by a single button as well as via an emergency stop button. The guide members 41, 43 provide for alignment of connector plates 34, 108. Further, the arrangement of the electronic testing assembly 10 provides for inaccessibility of moving parts to the operator as the actuation assembly 14 is activated to provide mechanical and electrical connection between the tester enclosure 18 and the activation assembly 14.

The design of the actuation assembly 14 including the design of the two groove slide blocks 68, 70 results in a simplified design with limited moving parts with simple translational actuation via actuator 66. The simplicity of the parts and motion involved in engaging and disengaging the tester enclosure 18 relative to the actuation assembly 14 can result in improved reliability, easier operation that reduces training requirements and opportunity for mistake by the operator, longevity of equipment life, improved safety, and the desired insurance or proper electrical connection for purposes of testing the device under test.

The actuator 66 can be, for example, a pneumatic actuator that operates under typical pressure supply of 80 psi. Other types of actuators can operate at different pressure levels. Further, the actuator 66 can be replaced by other types of actuators such as hydraulic, electrical, magnetic, or other types of linear actuators. The use of a pneumatically controlled actuator advantageously can be configured to require a two button engagement to activate or extend the actuator rod and then be released with a single release button or a single emergency stop button.

The electronics testing assembly 10 can be coupled to a continuous source of air pressure. The air supply is routed from a regulator (e.g., a regulator positioned within the control box 25 in the housing enclosure 22—see FIG. 2) to a control box that contains an electrical solenoid valve controlled via the circuitry of a control box operated by the operator. At least one optical sensor can be mounted within the housing 12 (e.g., on the activation assembly 14 such as the connector plate 34) to detect the presence of the tester enclosure 18 (e.g., the connector plate 108). When the tester enclosure 18 is detected, the circuitry of the control box is placed in an activation ready state. Upon the pressing and holding of the two engagement buttons 25A, B on the control panel 24, the pneumatic solenoid valve is energized, which causes the pneumatic arm of the actuator 66 to extend. Extension of the actuator arm moves the slide rod 60, 62 and the slide block 68, 70 in a generally horizontal direction. Similarly, pressing and holding the release button 27 or the emergency stop button 29 causes the actuator arm to retract and disengage the actuation assembly 14 from the tester enclosure 18. A safety benefit associated with using a pneumatic circuit is that removing power from the tester assembly 10 (e.g., by pressing the emergency stop button 29) automatically returns the actuator arm to the retracted position, thus disengaging the mechanical and electrical interface between the activation assembly 14 and the tester enclosure 18.

The Electrical Connectors Shown in FIG. 16

The electrical connections between the connectors supported on the connector plate 34 and the connector supported on the connector plate 108 must meet fully and without damage to provide a reliable signal path and maintain signal integrity between the device under test supported on the tester enclosure 18 and the test equipment supported in the housing 12. One example test panel that provides adequate reliability related to actual pin connections that can be supported on the connector plates 34, 108 is the Virginia panel™ 90 series made by Virginia Panel of Waynesboro, Va. The Virginia panel™ 90 series includes 12 total slots. Eight of those slots are predefined with the based instruments supported in the housing 12, with the remaining 4 slots empty in this configuration to provide room for future expansion and customization. The various modules or electrical connectors 132 supported in a panel 130 are noted in FIG. 16 as follows:

Slot 01—open/empty
Slot 02—64 bit digital I-O (bits 1-48)
Slot 03—64 bit digital I-O (bits 49-96)
Slot 04—miscellaneous instruments
Slot 05—coaxial connections
Slot 06—empty/open
Slot 07—relay converter
Slot 08—open/empty
Slot 09—air supplies 1-3
Slot 10—open/empty
Slot 11—low current power supplies
Slot 12—high current power supplies Other types of Virginia panel 90 series type panels and connector arrangements can be used such as, for example, 64- and 256-pin signal modules, low- and high-power modules, and coaxial modules rated up to 40 GHz.

CONCLUSION

One aspect of the present disclosure relates to an electronics testing assembly that includes a housing, a tester enclosure, and an activation assembly. The housing includes a top support surface defining a top opening, wherein the housing is configured to house at least one electronics testing device. The tester enclosure includes a first connector plate that is configured to support a plurality of tester connector interfaces. The activation assembly includes an actuator assembly and a second connector plate. The second connector plate is configured to support a plurality of activation connector interfaces. The actuator assembly is configured to move the second connector plate between a first (lowered) vertical position and a second (raised) vertical position within the housing while maintaining the first connector plate in a fixed vertical position relative to the housing.

Another aspect of the present disclosure relates to a tester activation assembly that includes a first rail member, a guide member, a slider, and a connector plate. The first rail member is movable along a first axis within a first plane. The guide member is configured to support the first rail member. The slider member is mounted to the first rail member and defines first and second grooves. The first groove extends in the same direction as the first axis within a second plane that is parallel to the first plane. The second groove extends in the same direction as the first axis and includes an angled portion that is oriented at an angle relative to the first plane. The connector plate is configured to support a plurality of activation connector interfaces and includes a follower member engaged with the second groove. The connector plate is configured to move in a direction perpendicular to the first plane as the first rail member moves the slide block relative to the guide member along the first axis.

A further aspect of the present disclosure relates to a method of making an electrical connection in an electronics test assembly. The electronics test assembly includes a tester assembly, a housing, and an activation assembly. The tester enclosure includes a first follower member and a first connector plate. The activation assembly includes first and second portions with the first portion including a second follower member and a second connector plate. The activation assembly is operatively mounted to the housing. The method includes the steps of positioning the tester enclosure at a mounted position relative to the housing, engaging the first and second follower members with the second portion of the activation assembly, and moving the second portion of the activation assembly in a first direction thereby releaseably securing the tester enclosure to the housing while moving the second connector plate relative to the first connector plate in a second direction that is perpendicular to the first direction to create an electrical connection without altering the mounted position of the tester enclosure.

The above specification provides examples of how certain inventive aspects may be put into practice. It will be appreciated that the inventive aspects can be practiced in other ways than those specifically shown without departing from the spirit and scope of the inventive aspects.

I claim:

1. A tester activation assembly, comprising:
   a first rail member movable along a first axis within a first plane;
   a guide member configured to support the first rail member;
   a slider member mounted to the first rail member, the slider member including first and second grooves, the first groove extending in the same direction as the first axis within a second plane that is parallel to the first plane, and the second groove extending in the same direction as the first axis and including an angled portion, the angled portion oriented at an angle relative to the first plane; and
   a connector plate, the connector plate configured to support a plurality of activation connector interfaces and including a follower member engaged with the second groove, wherein the connector plate is configured to move in a direction perpendicular to the first plane as the first rail member moves the slide block relative to the guide member along the first axis.

2. The assembly of claim 1, further comprising at least one guide member mounted to the first rail member and extending through the connector plate, the guide member restricting movement of the connector plate to movement in the direction perpendicular to the first plane.

3. The assembly of claim 1, further comprising a second rail member mounted to the first rail member, a space being defined between a portion of the first rail member and a portion of the second rail member, wherein the connector plate is maintained in the space and moveable within the space.

4. The assembly of claim 1, further comprising an actuator operatively mounted to the first rail member, wherein actuation of the actuator moves the first rail member along the first axis within the first plane.

5. The assembly of claim 4, wherein the actuator is a pneumatically operated actuator.

6. The assembly of claim 4, further comprising an actuator mounting member, a base portion of the actuator mounted to the actuator mounting member and a movable arm of the actuator operatively mounted to the first rail member, wherein the guide member is mounted to the actuator mounting member.

* * * * *